United States Patent
Liang et al.

(10) Patent No.: US 11,828,788 B2
(45) Date of Patent: Nov. 28, 2023

(54) SINGLE-EVENT TRANSIENT (SET) PULSE MEASURING CIRCUIT CAPABLE OF ELIMINATING IMPACT THEREOF, AND INTEGRATED CIRCUIT CHIP

(71) Applicant: National University of Defense Technology, Changsha (CN)

(72) Inventors: Bin Liang, Changsha (CN); Xiaoyu Zhang, Changsha (CN); Yaqing Chi, Changsha (CN); Jianjun Chen, Changsha (CN); Hengzhou Yuan, Changsha (CN); Deng Luo, Changsha (CN)

(73) Assignee: National University of Defense Technology, Changsha (CN)

( * ) Notice: Subject to any disclaimer, the term of this patent is extended or adjusted under 35 U.S.C. 154(b) by 0 days.

(21) Appl. No.: 17/852,787

(22) Filed: Jun. 29, 2022

(65) Prior Publication Data

US 2023/0008982 A1    Jan. 12, 2023

(30) Foreign Application Priority Data

Jul. 8, 2021   (CN) ............................ 202110774788

(51) Int. Cl.
*G01R 15/18*    (2006.01)
*G01R 31/28*    (2006.01)
*G01R 1/22*     (2006.01)
*H01F 38/30*    (2006.01)
*H01F 38/28*    (2006.01)

(52) U.S. Cl.
CPC ........... *G01R 31/2851* (2013.01); *G01R 1/22* (2013.01); *G01R 15/181* (2013.01); *G01R 15/183* (2013.01); *H01F 38/28* (2013.01); *H01F 38/30* (2013.01); *H01F 2038/305* (2013.01)

(58) Field of Classification Search
CPC .......... G01R 31/2851; G01R 31/31816; G01R 31/2881; G01R 23/02; G01R 1/22; G01R 15/181; G01R 15/183; Y02E 30/30; H01F 38/30; H01F 38/28; H01F 2038/305
USPC .... 324/73, 76.11–76.83, 126, 127, 315, 340, 324/356, 362, 370, 374, 375, 379, 455, 324/714
See application file for complete search history.

(56) References Cited

U.S. PATENT DOCUMENTS

2012/0274352 A1* 11/2012 Dumitru .......... G01R 31/31816
                                                                    326/16
2015/0331026 A1* 11/2015 Patel .................. G01R 1/30
                                                                    324/76.39

(Continued)

*Primary Examiner* — Raul J Rios Russo
(74) *Attorney, Agent, or Firm* — John H. Choi & Associates

(57) ABSTRACT

The present disclosure discloses a Single-Event Transient (SET) pulse measuring circuit capable of eliminating impact thereof, and an integrated circuit chip. The SET pulse measuring circuit capable of eliminating impact thereof includes four parts: a SET pulse test chain, a latch circuit, a flip-flop test circuit, a latching self-trigger circuit. The integrated circuit chip is provided with a test chain module and two sets of SET pulse measuring circuits capable of eliminating impact thereof, and inputs of the two sets of SET pulse measuring circuits capable of eliminating impact thereof are the same and each are connected to an output terminal of the test chain module.

20 Claims, 5 Drawing Sheets

(56) References Cited

U.S. PATENT DOCUMENTS

2018/0203067 A1* 7/2018 Chen ................ G01R 31/31723
2019/0018062 A1* 1/2019 Urard ............. G01R 31/318594

* cited by examiner

SINGLE-EVENT TRANSIENT (SET) PULSE MEASURING CIRCUIT CAPABLE OF ELIMINATING IMPACT THEREOF, AND INTEGRATED CIRCUIT CHIP

CROSS REFERENCE TO RELATED APPLICATION

This patent application claims the benefit and priority of Chinese Patent Application No. 202110774788.1, filed on Jul. 8, 2021, the disclosure of which is incorporated by reference herein in its entirety as part of the present application.

TECHNICAL FIELD

The present disclosure relates to integrated circuit testing technologies, and in particular, relates to a Single-Event Transient (SET) pulse measuring circuit capable of eliminating impact thereof, and an integrated circuit chip.

BACKGROUND ART

A microelectronic system applied in aerospace and aviation is prone to a radiation effect and fails. Radiation effects can be divided into Total Ionizing Dose (TID), Displacement Damage, and Single-Event Effect (SEE) based on different damage mechanisms. With the reduction of the process size of a device in an integrated circuit, impact of the total ionizing dose effect on a chip is gradually reduced, and the single-event effect has become a main factor in radiation failure.

Single-Event Transient (SET), as a kind of single-event effect, is usually a phenomenon of a sudden change of circuit functions caused by cosmic rays, solar particle events, natural decay of transuranic materials, or bombardment against a circuit by high-energy particles that are generated by a nuclear weapon explosion. After a semiconductor device is bombarded by single particles, energy deposition of high-energy particles will lead to ionization by collision of the particles, and ionized charges are collected and transported under the action of concentration gradients and electric fields, resulting in sudden transient changes in current and voltage at circuit nodes. A single-event transient pulse is latched by a latch circuit, and a soft error occurs. Therefore, how to reduce a single-event transient pulse width is the focus of scholars all around the world; accurate measurement of the single-event transient pulse width is the basis for the design and reinforcement of an anti-irradiation integrated circuit.

The widely used international SET pulse measuring circuit is shown in FIG. 1 (an on-chip self-trigger circuit capable of measuring a SET pulse width that is first proposed in the article "On-Chip Characterization of Single-Event Transient Pulsewidths" published by Narasimham, et al. in IEEE Transaction on Device and Materials Reliability in 2006). The principle is to make an input in FIG. 1 be fixed at 0 or 1. In response to absence of a SET pulse, the measuring circuit maintains a regular 01 sequence; in response to a SET pulse appearing, a transition at the output of some inverters occurs. In addition, a state of the inverter affected by a leading edge or a trailing edge is also known, so that there are two nodes, in an inverter chain, where outputs of consecutive inverters are the same. A width of the SET pulse can be calculated based on the number of inverters between the two nodes and an inverter propagation delay.

This measuring circuit can obtain a relatively accurate SET pulse width, and its accuracy is related to the propagation delay of the inverter in the measuring circuit. However, in an actual experiment, the entire chip is exposed to a single-particle environment, and the SET pulse generated by bombardment of the measuring circuit is recorded, thereby increasing the number of SET pulses of the circuit under test. Further, when a certain node of the measuring circuit is bombarded and a transition occurs, two consecutive SET pulses are connected, which results in a larger pulse and therefore makes it impossible to accurately evaluate an anti-irradiation capacity of a test chip. As the process size reduces, a circuit clock frequency continues to rise, making the above cases more frequent.

The above analysis shows that eliminating the impact of the measuring circuit is of great significance for accurately measuring the SET pulse width of the circuit under test.

SUMMARY

The technical problem to be solved by the present disclosure is as follows: during an experiment of an anti-irradiation test chip, because a whole circuit is completely exposed to an irradiation environment, a SET pulse measuring circuit will inevitably generate extra SET pulses, causing a deviation between an experimental result of the test chip from actual anti-irradiation performance of the chip. In view of the above problems in the prior art, an integrated circuit chip and a SET pulse measuring circuit capable of eliminating impact thereof are provided. The present disclosure aims to solve the problem existing in the SET pulse measuring circuit in the current anti-irradiation test chip. The present disclosure can completely eliminate extra SET pulse impact generated by the measuring circuit that is bombarded, so that an experimental result of the test chip can more accurately reflect anti-irradiation performance of the chip, and the research on the anti-irradiation integrated circuit has more guiding significance.

To solve the above technical problems, the technical solutions adopted by the present disclosure are as follows:

A SET pulse measuring circuit capable of eliminating impact thereof, including:

a SET pulse test chain, configured to propagate pulse status information, and including a plurality of inverters cascaded in sequence in a chain;

a latch circuit, including latches in a one-to-one correspondence with the inverters in the SET pulse test chain, where an output of each stage of inverter is connected to a corresponding latch to store level information of the stage of inverter node;

a flip-flop test circuit, configured to store a hold state in the latch circuit into a shift register, and realize serial output in a subsequent clock cycle; and a latching self-trigger circuit, using an output of an inverter of an even-numbered stage i in the SET pulse test chain as an input control signal, configured to: when a pulse signal propagates to an output terminal of the inverter of the even-numbered stage i in the SET pulse test chain, trigger generating a high-to-low hold (HOLD) signal and an inverse signal PASS thereof, where the hold (HOLD) signal is connected to each latch in the latch circuit to make the latch change to a hold state, so that a signal in each latch in this case is a current state value of each inverter node in the SET pulse test chain.

Optionally, the latch in the latch circuit is a high-level conducted and low-level latched circuit, and the HOLD signal effectively controls status information of a pulse on the latching test chain.

Optionally, the shift register in the flip-flop test circuit includes selectors and flip-flops that are in a one-to-one correspondence with the latches in the latch circuit. The selector is configured to: select one of an output Qi of a corresponding latch, an output of a previous-stage flip-flop, or an initial signal D as an input of a same-stage flip-flop under the control of W/R; and use an output of the flip-flop as one input of a next-stage selector, to enable an output signal of the last-stage flip-flop to be output through an output terminal Q, and enable a control signal S0 of the first-stage selector to become a high-level signal after the hold (HOLD) signal becomes a low-level signal, so as to store a latch signal into the shift register. In this way, the control signal S0 will return to a low level subsequently, so that the output terminal Q of the flip-flop test circuit will output a signal value of each node in the SET pulse test chain in series.

Optionally, the latching self-trigger circuit includes a NAND gate, a latch, and two inverter series branches consisting of a plurality of inverters connected in series, where one input of the NAND gate is the output of the inverter of the even-numbered stage i in the SET pulse test chain, and another input is a reset control signal (RESET). After an output of the NAND gate is latched, an output terminal of the latch generates a hold (HOLD) signal through one inverter series branch, and an inverting output terminal of the latch generates an inverse signal PASS of the hold (HOLD) signal through the other inverter series branch.

Optionally, the inverter series branch consists of four inverters connected in series.

Optionally, the SET pulse test chain includes a plurality of inverters cascaded in sequence, and using the output of the inverter of the even-numbered stage i in the SET pulse test chain as the input control signal means using an output of the 26th stage of inverter in the SET pulse test chain as the input control signal.

In addition, the embodiment further provides an integrated circuit chip, where the integrated circuit chip is provided with the SET pulse measuring circuit capable of eliminating impact thereof.

In addition, the embodiment further provides an integrated circuit chip, where the integrated circuit chip is provided with a test chain module and two sets of SET pulse measuring circuits capable of eliminating impact thereof, and inputs of the two sets of SET pulse measuring circuits capable of eliminating impact thereof are the same and each are connected to an output terminal of the test chain module.

In addition, the embodiment further provides a SET pulse measuring method for the integrated circuit chip, including:

(S1) powering on the tested integrated circuit chip;

(S2) placing the tested integrated circuit chip in an irradiation environment to perform a SET experiment, if particle bombarding occurs during the SET experiment, capturing a pulse width of a SET pulse measuring circuit capable of eliminating impact thereof, determining whether outputs of two sets of SET pulse measuring circuits capable of eliminating impact thereof are completely consistent, and if the outputs are completely consistent, determining that the measured pulse width is an externally input SET pulse.

Optionally, after step (S1) and before (S2), the method further includes the step of determining whether the outputs of the two sets of SET pulse measuring circuits, in the tested integrated circuit chip, capable of eliminating impact thereof are consistent; and if the outputs are consistent, proceeding to step (S2); or if the outputs are inconsistent, ending the process and exiting.

Compared with the prior art, the present disclosure has the following advantages:

During an experiment of an anti-irradiation test chip, because a whole circuit is completely exposed to an irradiation environment, a SET pulse measuring circuit will inevitably generate extra SET pulses, causing a deviation between an experimental result of the test chip from actual anti-irradiation performance of the chip. The present disclosure can completely eliminate extra SET pulse impact generated by the measuring circuit that is bombarded, so that the experimental result of the test chip can more accurately reflect anti-irradiation performance of the chip, and the research on the anti-irradiation integrated circuit has more guiding significance.

DETAILED DESCRIPTION OF THE EMBODIMENTS

Figure 1:
FIG. 1 shows a SET pulse measuring circuit widely used in the prior art.
Figure 2:
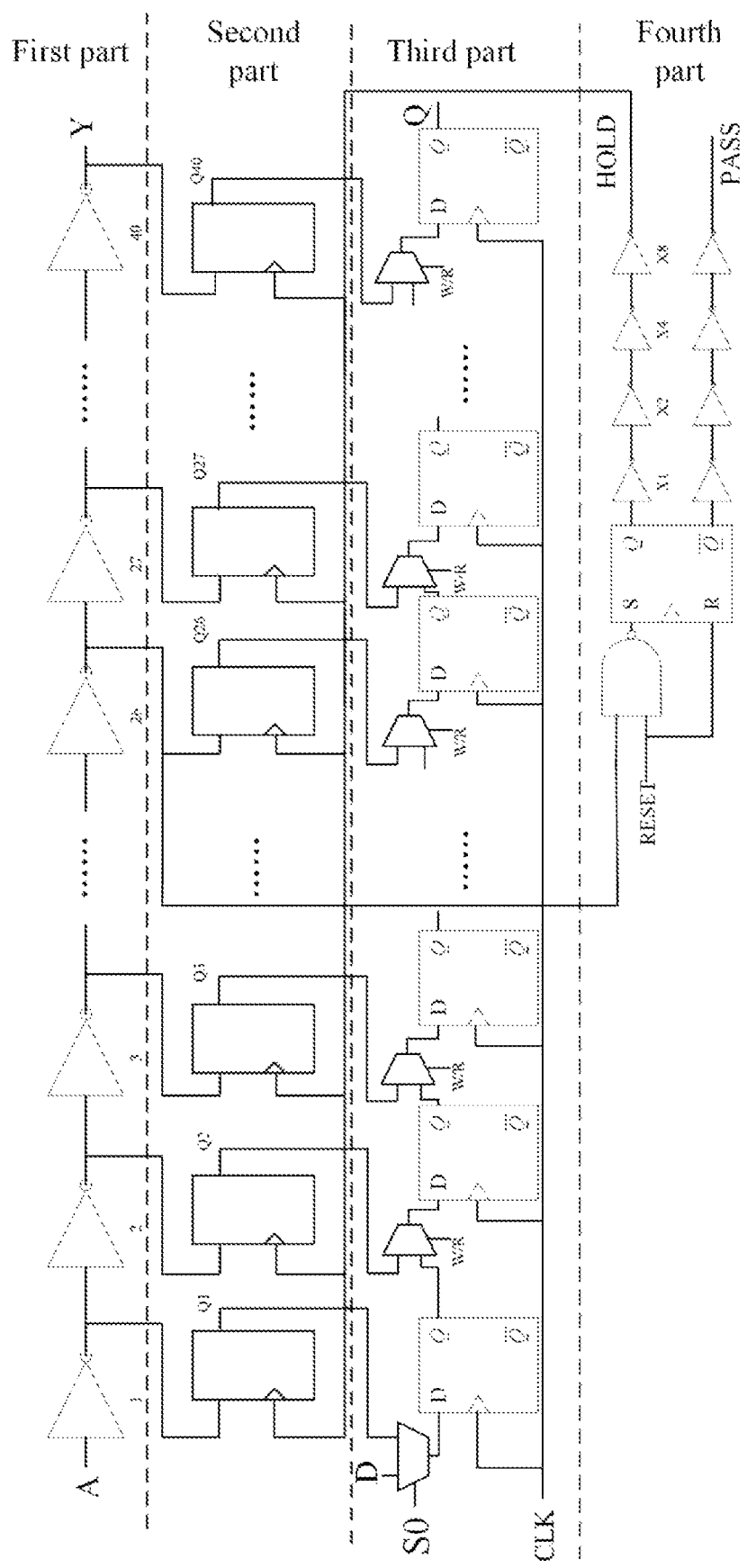
FIG. 2 shows a single SET pulse measuring circuit module used in the present disclosure.

As shown in FIG. 2, an embodiment provides a SET pulse measuring circuit capable of eliminating impact thereof, including:

a SET pulse test chain is configured to propagate pulse status information through a plurality of inverters cascaded in sequence in a chain; a latch circuit, which includes latches in a one-to-one correspondence with the inverters in the SET pulse test chain, whereby output of each stage of inverter is connected to a corresponding latch to store level information of the stage of inverter node;

a flip-flop test circuit, configured to store a hold state in the latch circuit into a shift register, and realize serial output in a subsequent clock cycle; and a latching self-trigger circuit, using an output of an inverter of an even-numbered stage i in the SET pulse test chain as an input control signal, which operates as follows: when a pulse signal propagates to an output terminal of the inverter of the even-numbered stage i in the SET pulse test chain, a trigger generating a high-to-low hold (HOLD) signal and an inverse signal PASS thereof, where the hold (HOLD) signal is connected to each latch in the latch circuit to make the latch change to a hold state, so that a signal in each latch in this case is a current state value of each inverter node in the SET pulse test chain.

In this embodiment, the latch in the latch circuit is a high-level conducted and low-level latched circuit, and the HOLD signal effectively controls status information of a pulse on the latching test chain.

In this embodiment, the shift register in the flip-flop test circuit includes selectors and flip-flops that are in a one-to-one correspondence with the latches in the latch circuit. The selector operates as follows: when an output Qi of a corresponding latch is selected an output of a previous-stage flip-flop or an initial signal D, as an input of a same-stage flip-flop, is under the control of W/R. Thereafter, an output of the flip-flop as one input of a next-stage selector enables an output signal of the last-stage flip-flop to be output through an output terminal Q, which enables a control signal S0 of the first-stage selector to become a high-level signal after the hold (HOLD) signal becomes a low-level signal, so as to store a latch signal into the shift register. In this way, the control signal S0 will return to a low level subsequently, so that the output terminal Q of the flip-flop test circuit will output a signal value of each node in the SET pulse test chain in series.

In this embodiment, the latching self-trigger circuit includes a NAND gate, a latch, and two inverter series branches consisting of a plurality of inverters connected in series, where one input of the NAND gate is the output of the inverter of the even-numbered stage i in the SET pulse test chain, and another input is a reset control signal (RESET). After an output of the NAND gate is latched, an output terminal of the latch generates a hold (HOLD) signal through one inverter series branch, and an inverting output terminal of the latch generates an inverse signal PASS of the hold (HOLD) signal through the other inverter series branch.

In this embodiment, the inverter series branch consists of four inverters connected in series.

In this embodiment, the SET pulse test chain includes a plurality of (40 in this embodiment) inverters cascaded in sequence, wherein the even numbered stage in the SET pulse test chain is the $26^{th}$ stage.

Refer to FIG. 2. The SET pulse measuring circuit that eliminates impact thereof in this embodiment includes the following parts: The first part is a SET pulse test chain (an inverter chain), which is used to propagate status information reflecting the pulse. When a stable level is input to an A port of the inverter chain, a level of each node in the inverter chain is also determined. When a transient pulse propagates in the chain, this pulse will cause a transition to occur at outputs of some inverters, and the state of a post-stage inverter affected by a leading edge or a trailing edge of the pulse is also determined. Therefore, there are two nodes in the inverter chain where outputs of consecutive inverters are the same. If there are N inverters between the two nodes, a width of the transient pulse equals N multiplied by a propagation delay of the inverters. If there are a plurality of pulses propagating in the test chain, the pulses need to be distinguished. The second part is latch circuits. An output of each stage of inverter is connected to a latch to store level information of the node. The latches are all high-level conducted and low-level latched circuits, and the HOLD signal effectively controls status information of a pulse on the latching test chain. The third part is flip-flop test circuits, which can reflect the number and width of SET transient pulses through the output Q of the flip-flop. An input signal of each flip-flop is provided by a one-of-two selectors, and two input data of the selector are a corresponding latch signal and an output signal of a previous-stage flip-flop in the second part. This enables a hold state of the latch in the second part of the circuit to be stored into the shift register while serial output is implemented in a subsequent clock cycle. When a selection signal S0 is at a high level, a latch signal is selected; when S0 is at a low level, the output signal of the previous-stage flip-flop is selected. The fourth part is latching self-trigger circuits. An output of the $i^{th}$ stage of inverter (i is an even-numbered stage) of the test chain is used as the input control signal of the trigger circuit. When the pulse signal in the inverter chain propagates to an output terminal of the $i^{th}$ stage, the trigger circuit will generate a HOLD signal that changes from a high level to a low level, and PASS is an inverse signal of the HOLD signal. The HOLD signal will enable the latch circuits in the second part and make the latches in the hold state. In this case, the signal in each latch is a current state value of each node in the inverter chain. Data required for the test can be obtained once the signals are output. In addition, after HOLD changes to a low level, the S0 signal is changed to a high level, and the latch signal is stored in the shift register. The S0 signal will return to a low level subsequently, so that the output terminal Q in the third part will output a signal value of each node in the inverter chain in series.

In addition, an embodiment further provides an integrated circuit chip, where the integrated circuit chip is provided with the foregoing SET pulse measuring circuit capable of eliminating impact thereof.

Figure 3:
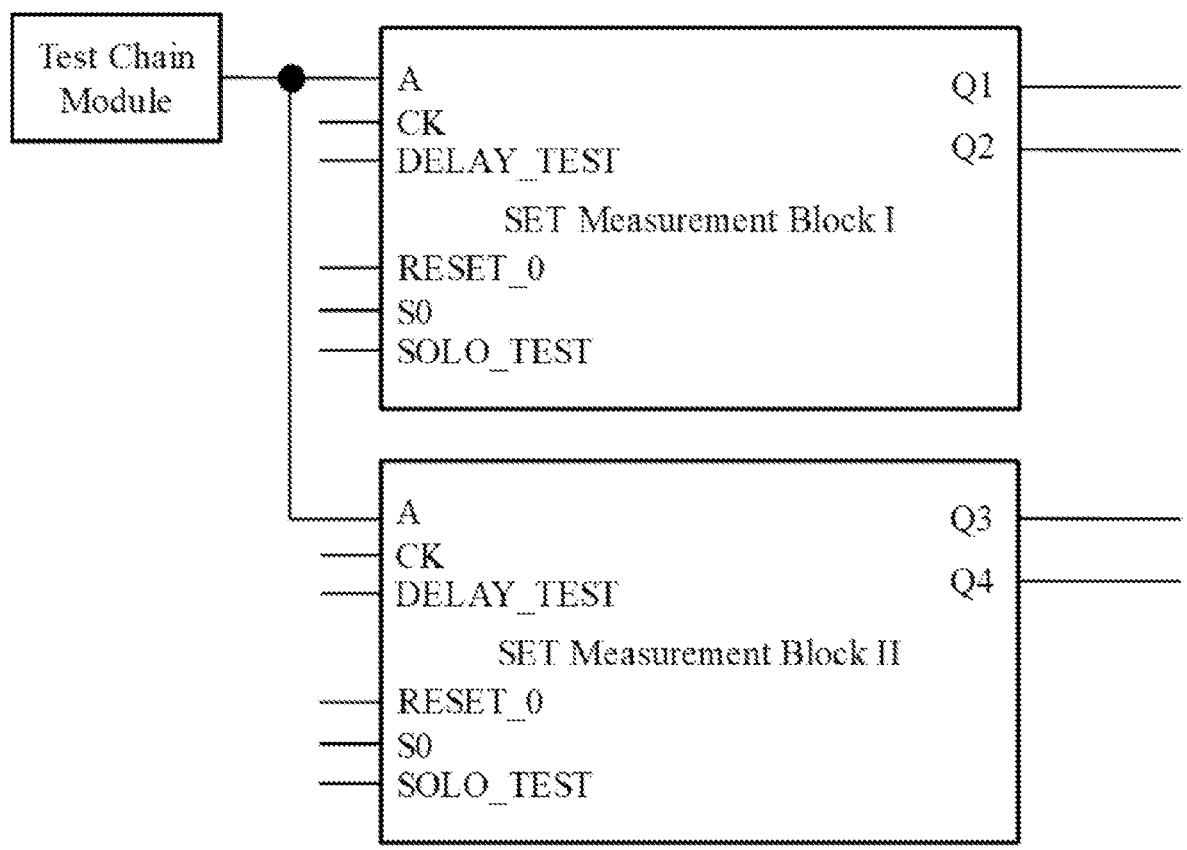
FIG. 3 shows a SET pulse width measuring circuit that completely eliminates impact of the measuring circuit according to the present disclosure.

In addition, as shown in FIG. 3, this embodiment further provides an integrated circuit chip. The integrated circuit chip is provided with a test chain module (Test Chain Module) and two sets of above-described SET pulse measuring circuits capable of eliminating impact thereof (shown as two blocks on the right), and inputs of the two sets of SET pulse measuring circuits capable of eliminating impact thereof are the same and each are connected to an output terminal of the test chain module, the output terminal being connected to an external host. Because input is the same, circuit structures and various process parameters have to be exactly the same. When the tested circuit generates a SET pulse, the two measuring circuits will record exactly the same SET pulse. However, a SET pulse generated by one measuring circuit that is bombarded is different from a SET pulse generated by the other measuring circuit.

Figure 4:
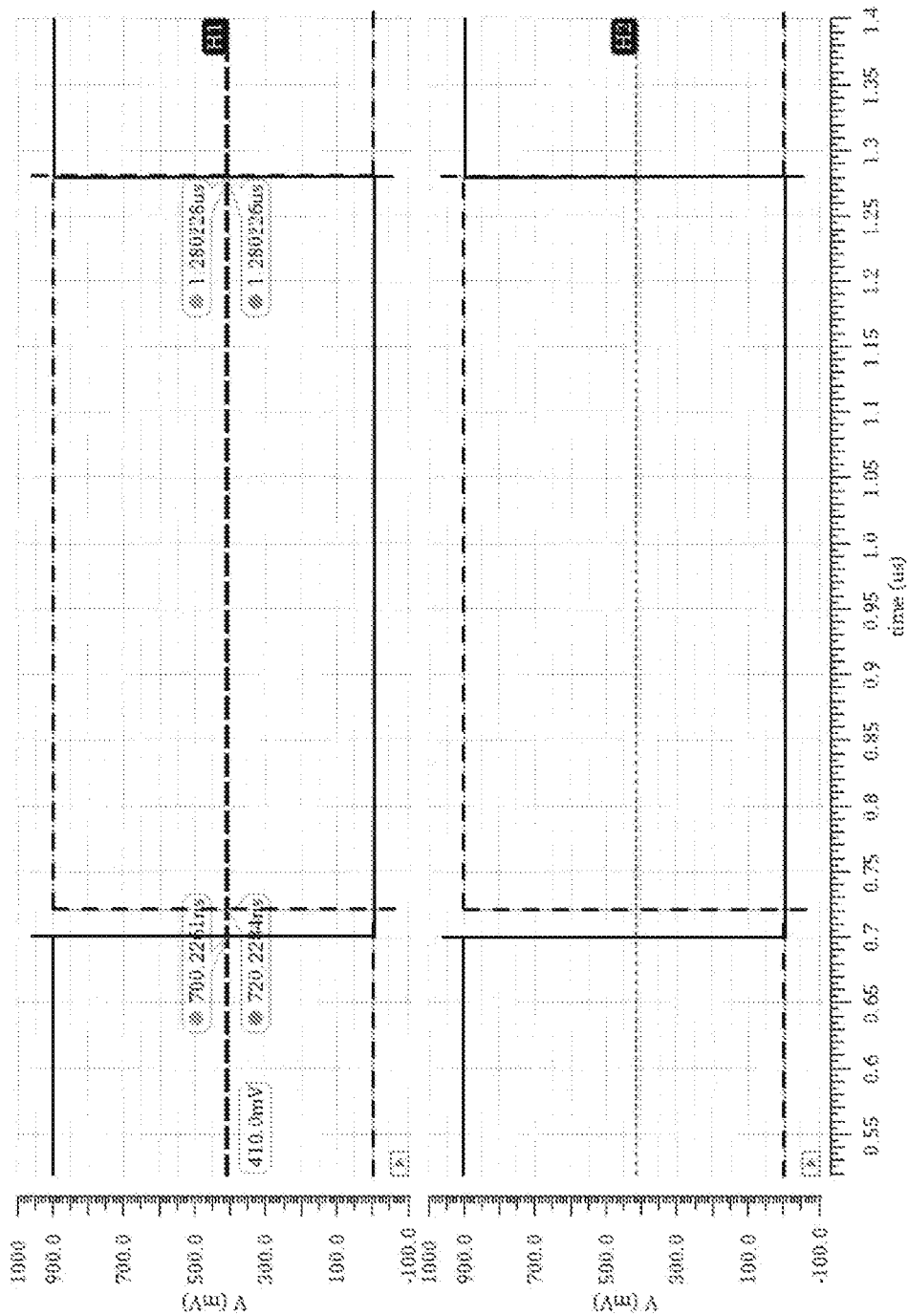
FIG. 4 shows a Spectre simulation result of measuring an externally inputted SET pulse width by using a SET pulse width measuring method that completely eliminates impact of the measuring circuit of the present disclosure.

FIG. 4 shows a Spectre simulation result of measuring an externally inputted SET pulse width by using a SET pulse width measuring method that completely eliminates impact of the measuring circuit of the present disclosure; and the simulation uses the measuring circuit shown in FIG. 3. As shown in FIG. 4, "RESET_0" is set to "0" first, and then set to "1" after the circuit is reset. "SOLO_TEST" terminal is set to "1" to turn off a SET self-test function, so that the circuit can measure a pulse width input at the input "A". "DELAY_TEST" is set to "1" to disable a circuit delay measurement function. The CK terminal inputs a 20 MHz clock signal, and the input "A" inputs a 309 ps "010" pulse. The figure shows waveforms corresponding to the four outputs "Q1", "Q2", "Q3" and "Q4", among which "Q1" and "Q2", and "Q3" and "Q4" are outputs of the measuring circuit 1 and the measuring circuit 2, respectively. It can be learned intuitively from an analog waveform that the outputs of the two measuring circuits are exactly the same, indicating that the measured pulse width is an externally input SET pulse. It can be obtained through calculation based on output signals shown by the waveform in the figure that, a transition occurs for 59 bits of "Q1" and "Q3", and a transition occurs for 57 bits of "Q2" and "Q4". Therefore, a transition occurs for a total of 58 bits. It can be obtained through calculation based on an inverter delay of 5.36 ps that, the captured SET pulse width is 311 ps, which is close to 309 ps of an analog input.

Figure 5:
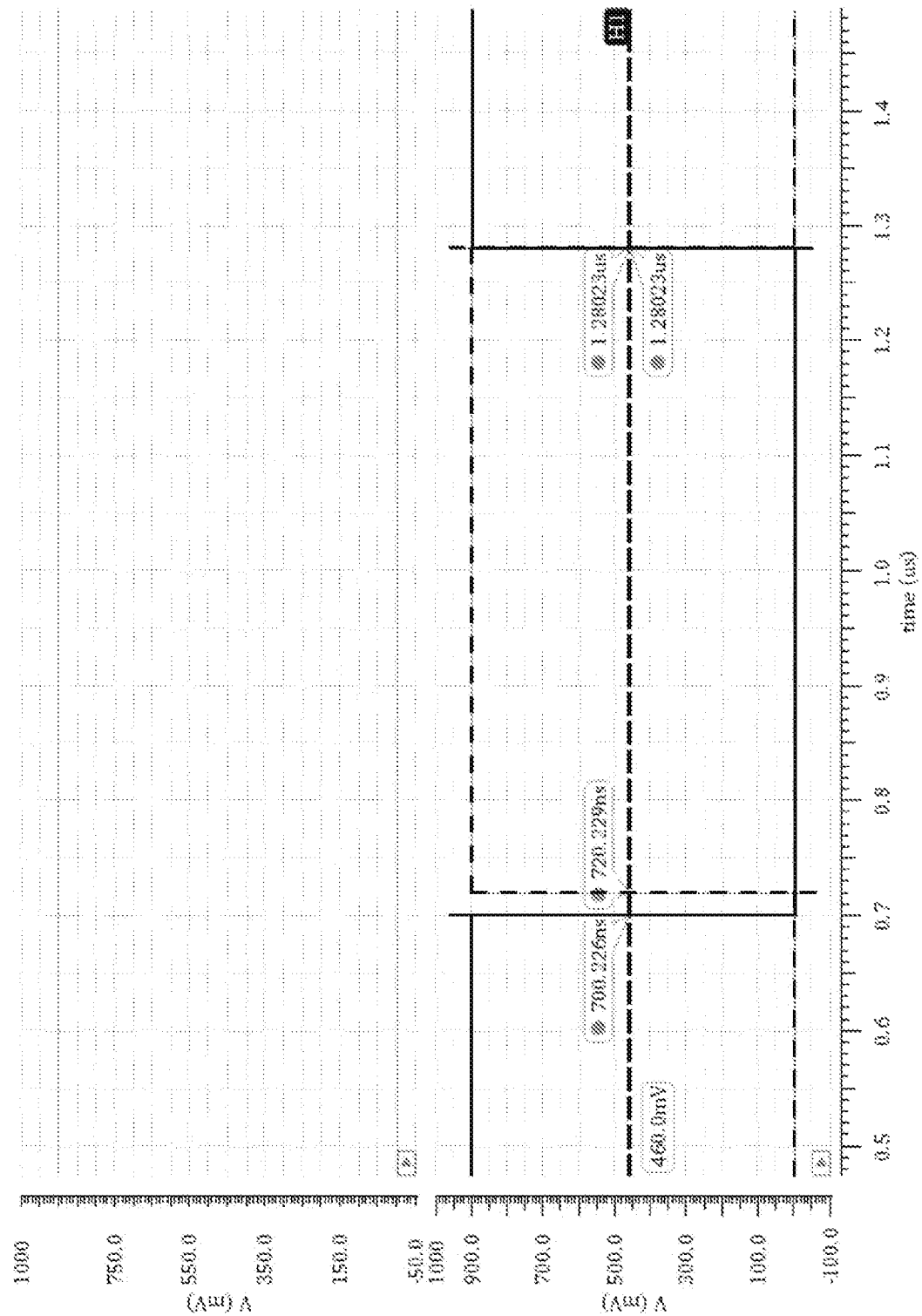
FIG. 5 shows a Spectre simulation result of measuring, by using a SET pulse width measuring method that completely eliminates impact of the measuring circuit of the present disclosure, a SET pulse width generated by the measuring circuit.

FIG. 5 shows a Spectre simulation result of measuring, by using a SET pulse width measuring method that completely eliminates impact of the measuring circuit of the present disclosure, a SET pulse width generated by the measuring circuit. The simulation still uses the measuring circuit shown in FIG. 3. The input "A" is grounded and kept at "0" to ensure that no SET pulse is input from the outside, and the other inputs are exactly the same as the previous simulation. A 309 ps "010" pulse is input into the measuring circuit 1 to simulate a SET pulse generated by the measuring circuit itself. It can be obtained through calculation based on output signals shown by the waveform in the figure that, a transition occurs for 59 bits of "Q1", a transition occurs for 57 bits of "Q2", and a transition does not occur for "Q3" or "Q4". This indicates that the measured pulse width is a SET pulse width generated by the measuring circuit itself. In an actual experiment, software is used to compare the outputs of the two measuring circuits to determine consistency of the outputs, to filter out the SET pulse generated by the measuring circuit itself, so as to make an experimental result more in line with an actual situation.

In addition, an embodiment further provides a SET pulse measuring method for the integrated circuit chip, including:

(S1) powering on the tested integrated circuit chip;

(S2) placing the tested integrated circuit chip in an irradiation environment to perform a SET experiment, if particle bombarding occurs during the SET experiment, capturing a pulse width of a SET pulse measuring circuit capable of eliminating impact thereof, determining whether outputs of two sets of SET pulse measuring circuits capable of eliminating impact thereof are completely consistent, and if the outputs are completely consistent, determining that the measured pulse width is an externally input SET pulse.

In this embodiment, after step (S1) and before (S2), the method further includes the step of determining whether the outputs of the two sets of SET pulse measuring circuits, in the tested integrated circuit chip, capable of eliminating impact thereof are consistent. If the outputs are consistent, proceed to step (S2), however, if the outputs are inconsistent, end the process and exit. When one measuring circuit is bombarded and generates a SET pulse, the measuring circuit generates a different output from the other measuring circuit, and the output will be filtered by software; when the two circuits generate the exact same SET pulse, a width of the pulse is recorded, and then a width of a SET pulse generated by the tested circuit that is bombarded can be obtained.

Those skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a CD-ROM, an optical memory, and the like) that include computer-usable program codes. The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by a computer or a processor of another programmable data processing device generate an apparatus for implementing a specific function in one or more processes in the flowcharts and/or in one or more blocks in the block diagrams. These computer program instructions may be stored in a computer-readable memory that can instruct the computer or any other programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams. These computer program instructions may be loaded onto a computer or another programmable data processing device, so that a series of operations and steps are performed on the computer or another programmable device, thereby generating computer-implemented processing. Therefore, the instructions executed on the computer or another programmable device provide steps for implementing a specific function in one or more processes in the flowcharts and/or in one or more blocks in the block diagrams.

The foregoing descriptions are only preferred implementations of the present disclosure, and the scope of the present disclosure is not limited to the foregoing embodiments. All technical solutions based on the idea of the present disclosure fall within the protection scope of the present disclosure. It should be noted that those of ordinary skill in the art can make several improvements and modifications without departing from the principles of the present disclosure. These improvements and modifications should also be considered as falling within the scope of the present disclosure.

The invention claimed is:

1. A Single-Event Transient (SET) pulse measuring circuit capable of eliminating impact thereof, comprising:
 a SET pulse test chain comprised of a plurality of inverters cascaded in sequence in a chain in a plurality of stages that are configured to propagate pulse status information;
 a latch circuit, comprising first latches in a one-to-one correspondence with the plurality of inverters in the SET pulse test chain, wherein an output of an inverter of each stage is connected to a corresponding first latch to store level information of an inverter node of the stage;
 a flip-flop test circuit, configured to store a hold state in the latch circuit into a shift register, and realize serial output in a subsequent clock cycle; and
 a latching self-trigger circuit, using an output of an inverter of an even-numbered stage i in the SET pulse test chain as an input control signal, the latching self-trigger circuit triggers and generates a high-to-low hold signal (HOLD) and an inverse signal PASS thereof when a pulse signal propagates to an output terminal of the inverter of the even-numbered stage i in the SET pulse test chain;
 wherein the high-to-low hold signal (HOLD) is connected to each first latch in the latch circuit to make the first latch change to the hold state, so that a signal in each first latch is a current state value of each inverter node in the SET pulse test chain.

2. The SET pulse measuring circuit capable of eliminating impact thereof according to claim 1, wherein the first latch in the latch circuit is a high-level conducted and low-level latched circuit, and the high-to-low hold signal (HOLD) effectively controls status information of a pulse on the latching test chain.

3. The SET pulse measuring circuit capable of eliminating impact thereof according to claim 2, wherein the shift register in the flip-flop test circuit comprises selectors and flip-flops that are in a one-to-one correspondence with the first latches in the latch circuit,
wherein the selector is configured to select one of an output Qi of a corresponding first latch, an output of a previous-stage flip-flop, and an initial signal D as an input of a same-stage flip-flop under control of a control port (W/R); and use an output of the flip-flop as one input of a next-stage selector to enable an output signal of the last-stage flip-flop to be output through an output terminal Q, and enable a control signal S0 of the first-stage selector to become a high-level signal after the high-to-low hold signal (HOLD) becomes a low-level signal so as to store a latch signal into the shift register, wherein the control signal S0 will subsequently return to a low level, so that the output terminal Q of the flip-flop test circuit will output a signal value of each node in the SET pulse test chain in series.

4. The SET pulse measuring circuit capable of eliminating impact thereof according to claim 3, wherein the latching self-trigger circuit comprises a NAND gate, a second latch, and two inverter series branches consisting of a plurality of inverters connected in series, wherein one input of the NAND gate is the output of the inverter of the even-numbered stage i in the SET pulse test chain and another input is a reset control signal (RESET); and after an output of the NAND gate is latched, an output terminal of the second latch generates the high-to-low hold signal (HOLD) through one inverter series branch, and an inverting output terminal of the second latch generates an inverse signal PASS of the high-to-low hold signal (HOLD) through the other inverter series branch.

5. The SET pulse measuring circuit capable of eliminating impact thereof according to claim 4, wherein the inverter series branch consists of four inverters connected in series.

6. The SET pulse measuring circuit capable of eliminating impact thereof according to claim 5, wherein the SET pulse test chain comprises a plurality of inverters cascaded in sequence, and using the output of the inverter of the even-numbered stage i in the SET pulse test chain as the input control signal, wherein the even-numbered stage in the SET pulse test chain is the $26^{th}$ stage.

7. An integrated circuit chip, wherein the integrated circuit chip is provided with a test chain module and two sets of SET pulse measuring circuits capable of eliminating impact thereof, according to claim 1, and inputs of the two sets of SET pulse measuring circuits capable of eliminating impact thereof are the same and each are connected to an output terminal of the test chain module.

8. The integrated circuit chip according to claim 7, wherein the first latch in the latch circuit is the high-level conducted and low-level latched circuit, and the high-to-low hold signal (HOLD) effectively controls status information of a pulse on the latching test chain.

9. The integrated circuit chip according to claim 8, wherein the shift register in the flip-flop test circuit comprises selectors and flip-flops that are in a one-to-one correspondence with the first latches in the latch circuit, wherein the selector is configured to: select one of an output Qi of a corresponding first latch, an output of a previous-stage flip-flop, and an initial signal D as an input of a same-stage flip-flop under control of a control part (W/R); and use an output of the flip-flop as one input of a next-stage selector, to enable an output signal of the last-stage flip-flop to be output through an output terminal Q and enable a control signal S0 of the first-stage selector to become a high-level signal after the high-to-low hold signal (HOLD) becomes a low-level signal, so as to store a latch signal into the shift register, wherein the control signal S0 will subsequently return to a low level so that the output terminal Q of the flip-flop test circuit will output a signal value of each node in the SET pulse test chain in series.

10. The integrated circuit chip according to claim 9, wherein the latching self-trigger circuit comprises a NAND gate, a second latch, and two inverter series branches consisting of a plurality of inverters connected in series;
wherein one input of the NAND gate is the output of the inverter of the even-numbered stage i in the SET pulse test chain, and another input is a reset control signal (RESET); and after an output of the NAND gate is latched, an output terminal of the second latch generates the high-to-low hold signal (HOLD) through one inverter series branch, and an inverting output terminal of the second latch generates an inverse signal PASS of the high-to-low hold signal (HOLD) through the other inverter series branch.

11. The integrated circuit chip according to claim 10, wherein the inverter series branch consists of four inverters connected in series.

12. The integrated circuit chip according to claim 11, wherein the SET pulse test chain comprises a plurality of inverters cascaded in sequence, and using the output of the inverter of the even-numbered stage i in the SET pulse test chain as the input control signal, wherein the even-numbered stage in the SET pulse test chain is the $26^{th}$ stage.

13. A SET pulse measuring method for an integrated circuit chip, wherein the integrated circuit chip is provided with a test chain module and two sets of SET pulse measuring circuits capable of eliminating impact thereof according to claim 1, and inputs of the two sets of SET pulse measuring circuits capable of eliminating impact thereof are the same and each are connected to an output terminal of the test chain module, and the SET pulse measuring method comprises:
(S1) powering on the tested integrated circuit chip;
(S2) placing the tested integrated circuit chip in an irradiation environment to perform a SET experiment, wherein if particle bombarding occurs during the SET experiment, capturing a pulse width of a SET pulse measuring circuit capable of eliminating impact thereof, determining whether outputs of two sets of SET pulse measuring circuits capable of eliminating impact thereof are completely consistent, and if the outputs are completely consistent, determining whether the measured pulse width is an externally input SET pulse.

14. The SET pulse measuring method for the integrated circuit chip according to claim 13, wherein the first latch in the latch circuit is a high-level conducted and low-level latched circuit, and the high-to-low hold signal (HOLD) effectively controls status information of a pulse on the latching test chain.

15. The SET pulse measuring method for the integrated circuit chip according to claim 14, wherein the shift register in the flip-flop test circuit comprises selectors and flip-flops that are in a one-to-one correspondence with the first latches in the latch circuit,
wherein the selector is configured to select one of an output Qi of a corresponding first latch, an output of a previous-stage flip-flop, and an initial signal D as an input of a same-stage flip-flop under control of a control port (W/R); and use an output of the flip-flop as one input of a next-stage selector, to enable an output signal of the last-stage flip-flop to be output through an output terminal Q, and enable a control signal S0 of the first-stage selector to become a high-level signal after the high-to-low hold signal (HOLD) becomes a low-level signal, so as to store a latch signal into the shift register, wherein the control signal S0 will subsequently return to a low level so that the output terminal Q of the flip-flop test circuit will output a signal value of each node in the SET pulse test chain in series.

16. The SET pulse measuring method for the integrated circuit chip according to claim 15, wherein the latching self-trigger circuit comprises a NAND gate, a second latch, and two inverter series branches consisting of a plurality of inverters connected in series, wherein one input of the NAND gate is the output of the inverter of the even-numbered stage i in the SET pulse test chain and another input is a reset control signal (RESET); and after an output of the NAND gate is latched, an output terminal of the second latch generates the high-to-low hold signal (HOLD) through one inverter series branch, and an inverting output terminal of the second latch generates an inverse signal PASS of the high-to-low hold signal (HOLD) through the other inverter series branch.

17. The SET pulse measuring method for the integrated circuit chip according to claim 16, wherein the inverter series branch consists of four inverters connected in series.

18. The SET pulse measuring method for the integrated circuit chip according to claim 17, wherein the SET pulse test chain comprises a plurality of inverters cascaded in sequence, and using the output of the inverter of the even-numbered stage i in the SET pulse test chain as the input control signal, wherein the even-numbered stage in the SET pulse test chain is the $26^{th}$ stage.

19. The SET pulse measuring method for the integrated circuit chip according to claim 13, wherein after step (S1) and before step (S2), the method further comprises the step of determining whether the outputs of the two sets of SET pulse measuring circuits in the tested integrated circuit chip are consistent; and if the outputs are consistent, proceeding to step (S2); but, if the outputs are inconsistent, ending the process and exiting.

20. The SET pulse measuring method for the integrated circuit chip according to claim 14, wherein after step (S1) and before step (S2), the method further comprises the step of determining whether the outputs of the two sets of SET pulse measuring circuits in the tested integrated circuit chip are consistent; and if the outputs are consistent, proceeding to step (S2); but, if the outputs are inconsistent, ending the process and exiting.

* * * * *